(12) United States Patent
Tago et al.

(10) Patent No.: US 9,629,249 B2
(45) Date of Patent: Apr. 18, 2017

(54) COMPONENT-EMBEDDED SUBSTRATE AND COMMUNICATION MODULE

(71) Applicant: Murata Manufacturing Co., Ltd., Kyoto (JP)

(72) Inventors: Shigeru Tago, Kyoto (JP); Yuki Wakabayashi, Kyoto (JP); Hirofumi Shinagawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/939,102

(22) Filed: Nov. 12, 2015

(65) Prior Publication Data
US 2016/0066428 A1 Mar. 3, 2016

Related U.S. Application Data

(63) Continuation of application No. PCT/JP2014/060577, filed on Apr. 14, 2014.

(30) Foreign Application Priority Data

May 14, 2013 (JP) .................... 2013-102054

(51) Int. Cl.
*H05K 1/18* (2006.01)
*H01L 23/538* (2006.01)
(Continued)

(52) U.S. Cl.
CPC ......... *H05K 1/185* (2013.01); *H01L 23/5389* (2013.01); *H01L 24/19* (2013.01);
(Continued)

(58) Field of Classification Search
USPC ............................... 361/761–764
See application file for complete search history.

(56) References Cited

U.S. PATENT DOCUMENTS 6,292,366 B1 * 9/2001 Platt ............... H01L 23/427
174/252
2005/0112798 A1 * 5/2005 Bjorbell .......... H01L 23/5385
438/106
(Continued)

FOREIGN PATENT DOCUMENTS

JP 2004-319757 A 11/2004
JP 2009-076833 A 4/2009
(Continued)

OTHER PUBLICATIONS

International Search Report issued in Application No. PCT/JP2014/060577 May 13, 2014.
(Continued)

*Primary Examiner* — Hoa C Nguyen
(74) *Attorney, Agent, or Firm* — Pearne & Gordon, LLP

(57) ABSTRACT

A component-embedded substrate includes a first embedded component positioned in a layer close to a mounting electrode and a second embedded component positioned in a layer farther away from the mounting electrode than the first embedded component. The first and second embedded components include electrically connected terminals. Each resin film of the substrate is formed of thermoplastic resin. The first embedded component has more terminals than the second embedded component. Many of the internal wires from the first and second embedded component extend towards a mounting surface where the mounting electrode is provided. However, since in plan view the area of the first embedded component is smaller than the second embedded component, and the first embedded component is disposed closer to the mounting surface than the second embedded component, there is space for routing the internal wires at the side of the mounting surface of the substrate.

18 Claims, 4 Drawing Sheets

(51) Int. Cl.
*H01L 23/00* (2006.01)
*H05K 1/02* (2006.01)
*H05K 1/03* (2006.01)
*H05K 1/11* (2006.01)
*H05K 3/46* (2006.01)

(52) U.S. Cl.
CPC ......... *H05K 1/0298* (2013.01); *H05K 1/0313* (2013.01); *H05K 1/11* (2013.01); *H05K 1/186* (2013.01); *H01L 2224/04105* (2013.01); *H05K 3/4617* (2013.01); *H05K 3/4632* (2013.01); *H05K 2201/0141* (2013.01); *H05K 2201/0154* (2013.01); *H05K 2201/10515* (2013.01)

(56) References Cited

U.S. PATENT DOCUMENTS

| | | | |
|---|---|---|---|
| 2005/0122698 A1 | 6/2005 | Ho | |
| 2007/0178279 A1* | 8/2007 | Ogawa | H01L 23/5389 428/137 |
| 2008/0117608 A1* | 5/2008 | Seo | H01L 24/82 361/761 |
| 2008/0196931 A1* | 8/2008 | Lee | H01L 23/49822 174/260 |
| 2008/0273314 A1* | 11/2008 | Cho | H01L 21/568 361/764 |
| 2009/0071705 A1 | 3/2009 | Kim | |
| 2009/0188703 A1 | 7/2009 | Ito | |
| 2010/0142170 A1* | 6/2010 | Kim | H01L 21/6835 361/762 |
| 2010/0224992 A1 | 9/2010 | McConnelee | |
| 2011/0116246 A1* | 5/2011 | Lee | H05K 1/18 361/761 |
| 2012/0020044 A1* | 1/2012 | Iihola | H01L 21/4828 361/783 |
| 2012/0134125 A1* | 5/2012 | Kim | H01L 24/24 361/764 |

FOREIGN PATENT DOCUMENTS

| | | |
|---|---|---|
| JP | 2009-117501 A | 5/2009 |
| JP | 2010-212683 A | 9/2010 |
| JP | 2011-249410 A | 12/2011 |
| JP | 4876173 B2 | 2/2012 |
| WO | 2013/062031 A1 | 5/2013 |

OTHER PUBLICATIONS

Written Opinion issued in Application No. PCT/JP2014/060577 May 13, 2014.
Office Action issued in Japanese Patent Application No. 2014-533294 dated Sep. 2, 2014.

* cited by examiner

COMPONENT-EMBEDDED SUBSTRATE AND COMMUNICATION MODULE

BACKGROUND OF THE INVENTION

1. Field of the Invention

The present disclosure relates to a component-embedded substrate provided with a plurality of components that are embedded in a multilayer substrate and to a communication module using the component-embedded substrate.

2. Description of the Related Art

Hitherto, in order to reduce the size of electronic devices, there has been a demand for high density mounting in which a plurality of components are mounted in a substrate.

A structure in which two integrated circuits (ICs) are embedded in a multilayer printed circuit board including a plurality of insulating layers and conductive layers that are alternately stacked upon each other is disclosed in Japanese Unexamined Patent Application Publication No. 2009-117501 (Patent Literature (PTL) 1).

In the multilayer printed circuit board in PTL 1, two ICs are disposed in different layers of the multilayer printed circuit board. Electrodes (terminals) of the ICs are routed to the outside or to another internal circuit via internal wires that are formed in the multilayer printed circuit board.

When, as in the multilayer printed circuit board in PTL 1, external connection electrodes are provided at a mounting surface of a component-embedded substrate provided with two embedded components (ICs), internal wires from the IC disposed adjacent to a surface opposing the mounting surface and internal wires from the IC disposed adjacent to the mounting surface are provided close together at portions adjacent to the mounting surface. The more electrodes (terminals) of the ICs, the more internal wires. As a result, the internal wires are provided closer together at the portions adjacent to the mounting surface, and, thus, it becomes more difficult to route the internal wires.

In order to provide space between the internal wires, a region in correspondence with this may be provided in the multilayer printed circuit board. However, the external shape of the multilayer printed circuit board becomes large in size.

SUMMARY OF THE INVENTION

Accordingly, it is an object of the present disclosure to provide a component-embedded substrate and a communication module that do not increase in size even if a plurality of components are embedded therein.

According to an aspect of the present disclosure, there is provided a component-embedded substrate in which a plurality of embedded components that are electrically connected are provided in a multilayer substrate including a plurality of resin films that are stacked upon each other, and in which a mounting electrode is formed at a principal surface. The component-embedded substrate includes a first embedded component that is positioned in a layer that is close to the mounting electrode, the first embedded component including terminals that are electrically connected; and a second embedded component that is positioned in a layer that is farther away from the mounting electrode than the layer where the first embedded component is positioned, the second embedded component including terminals that are electrically connected. Each resin film is formed of thermoplastic resin. The number of terminals of the first embedded component is larger than the number of terminals of the second embedded component. In plan view, an area of the first embedded component is smaller than an area of the second embedded component.

Many of the terminals of the first embedded component and the terminals of the second embedded component are electrically connected to the mounting electrode through internal wires. In other words, for example, many of the internal wires from the first embedded component and the internal wires from the second embedded component each extend towards the mounting surface where the mounting electrode is provided. As a result, the internal wires are disposed close to each other at portions adjacent to the mounting surface of the multilayer substrate. As a result, it becomes difficult to route the internal wires. Since the number of terminals of the first embedded component is larger than the number of terminals of the second embedded component, it becomes more difficult to route the internal wires.

However, since in plan view the area of the first embedded component is smaller than the area of the second embedded component, and the first embedded component is disposed closer to the mounting surface than the second embedded component, it is possible to provide space for routing the internal wires at portions adjacent to the mounting surface of the multilayer substrate.

As mentioned above, even if the number of terminals of the first embedded component is large, it is possible to provide the first embedded component and the second embedded component in the component-embedded substrate without increasing the size of the external shape of the multilayer substrate to provide space for routing the internal wires, or without increasing the number of layers to route the internal wires to upper and lower layers. In other words, for example, even if the number of terminals of the first embedded component is large, it is possible to provide the first embedded component and the second embedded component in the component-embedded substrate with the size of the component-embedded substrate being kept small.

When a plurality of sheets including thermoplastic resin (such as polyimide or liquid crystal polymer) are stacked upon each other all at once and the stack is subjected to heating and pressure bonding, a multilayer substrate is formed. An existing build-up method in which a build-up layer is formed by stacking resin layers one layer at a time requires a base, which becomes a core layer, to have a certain thickness. However, unlike the existing build-up method, the stacking method for the multilayer substrate according to the present disclosure does not require a base, which becomes a core layer. As a result, the thickness of the multilayer substrate can be restricted. In addition, in the method for producing the multilayer substrate according to the present disclosure, it is not necessary to stack layers one layer at a time. Therefore, the method according to the present disclosure is simpler than the existing build-up method.

In plan view, the first embedded component may be covered by the second embedded component, or may be completely covered by the second embedded component.

In plan view, as the amount by which the first embedded component is covered by the second embedded component is increased, it is possible to reduce the area of one principal surface of the multilayer substrate. Even in this case, the area of the first embedded component is smaller than the area of the second embedded component, and the first embedded component is disposed closer to the mounting surface than the second embedded component. Therefore, it is possible to further reduce the size of the component-embedded substrate while providing space for routing the internal wires.

The terminals of the first embedded component and the terminals of the second embedded component may include a terminal or terminals that are electrically connected to an interlayer connection conductor formed at the multilayer substrate.

In order to electrically connect the internal wires with the terminals of the first embedded component and the second embedded component, it is not necessary to separately provide, for example, solder bumps or layers to which solder has been applied. As a result, the component-embedded substrate becomes thinner than when, for example, layers to which solder has been applied are provided.

The second embedded component may be one that less easily emits an electromagnetic wave than the first embedded component.

Even if the first embedded component emits electromagnetic waves, since the second embedded component that is disposed adjacent to a surface that opposes the mounting surface serves as an electromagnetic shield, the electromagnetic waves are not easily emitted out of the component-embedded substrate.

According to another aspect of the present disclosure, there is provided a communication module including any one of the component embedded substrates, wherein the first embedded component is an RFIC that processes a high-frequency signal, and the second embedded component is a secure IC having a security function.

The present disclosure makes it possible to provide a component-embedded substrate and a communication module allowing a plurality of components to be embedded therein without increasing the sizes thereof.

DESCRIPTION OF THE PREFERRED EMBODIMENT

With reference to FIGS. 1A to 4, a component-embedded substrate 1 according to an embodiment is described.

Figure 1A:
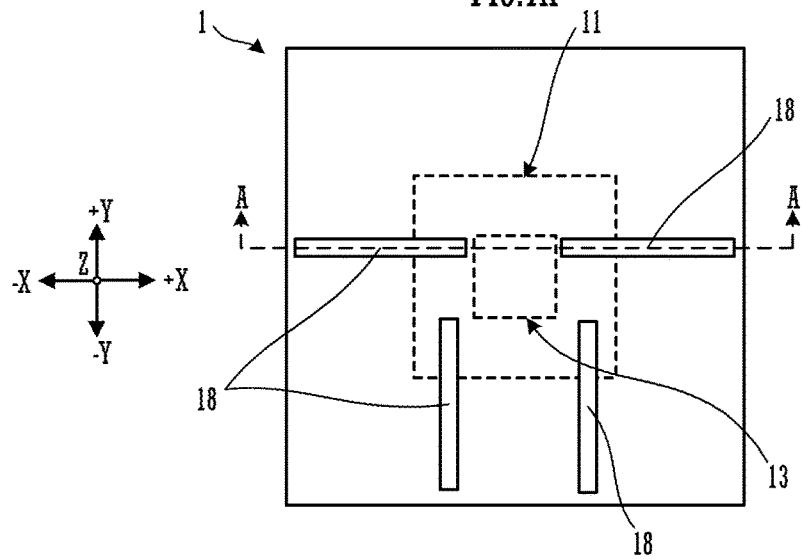
FIG. 1A is a top view of a component-embedded substrate according to an embodiment.
Figure 1B:
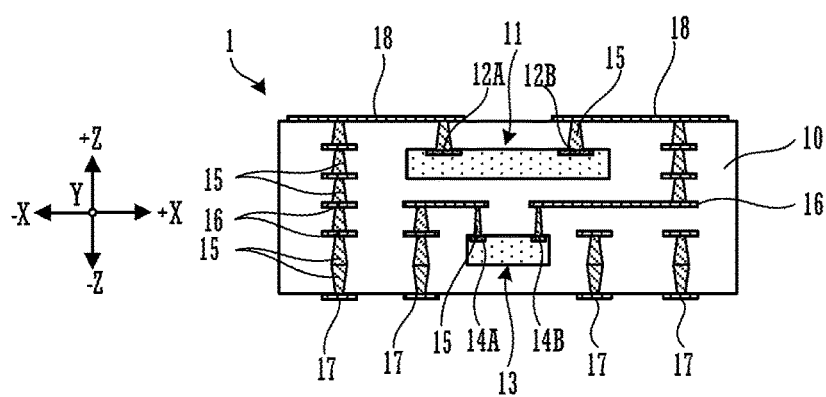
FIG. 1B is a sectional view taken along line A-A of the component-embedded substrate according to the embodiment.
Figure 1C:
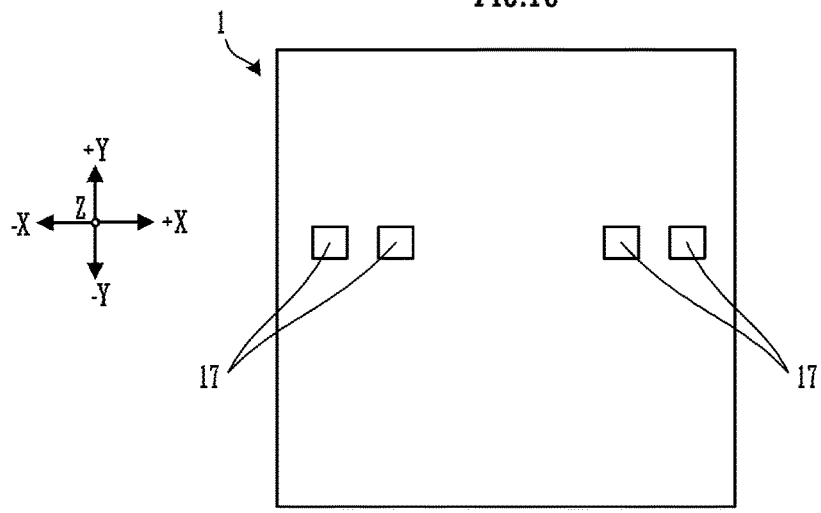
FIG. 1C is a bottom view of the component-embedded substrate according to the embodiment.
Figure 2A:
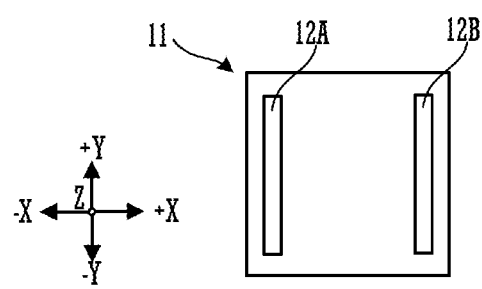
FIG. 2A is a top view of a secure IC.
Figure 2B:
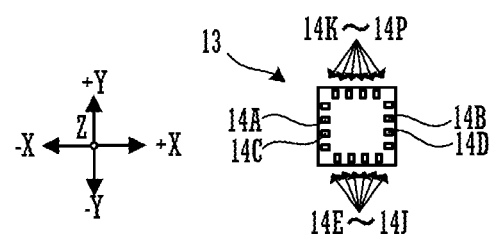
FIG. 2B is a top view of a radio frequency integrated circuit (RFIC).

FIG. 1A is a top view of the component-embedded substrate 1 according to the embodiment. FIG. 1B is a sectional view taken along line A-A of the component-embedded substrate 1. FIG. 1C is a bottom view of the component-embedded substrate 1. FIG. 1C only shows mounting electrodes 17 that are required for describing the component-embedded substrate 1. FIG. 2A is a top view of a secure IC 11 and FIG. 2B is a top view of an RFIC 13. In FIG. 1B, a surface of the component-embedded substrate 1 situated in a direction +Z is defined as a top surface of the component-embedded substrate 1, and a surface of the component-embedded substrate 1 situated in a direction −Z is defined as a bottom surface of the component-embedded substrate 1.

As shown in FIGS. 1A and 1C, the component-embedded substrate 1 has, for example, a rectangular parallelepiped shape, with the height of the component-embedded substrate 1 in the height directions (the directions +Z and −Z in FIGS. 1A and 1C) being smaller than the width of the component-embedded substrate 1 in width directions (directions +X and −X in FIGS. 1A and 1C) and the depth of the component-embedded substrate 1 in depth directions (directions +Y and −Y in FIGS. 1A and 1C). The height of the actual component-embedded substrate 1 can be small (for example, 0.5 mm). However, in FIG. 1B, the component-embedded substrate 1 is shown as having a height that is larger than the actual height for describing the component-embedded substrate 1.

The component-embedded substrate 1 includes a multilayer substrate 10, a plurality of mounting electrodes 17, and a plurality of wires 18.

The multilayer substrate 10 has a rectangular parallelepiped shape and includes insulating resin films 100 to 105 (described in detail below) that are stacked upon each other.

As shown in FIGS. 1B and 1C, the plurality of mounting electrodes 17 are provided at a bottom surface of the multilayer substrate 10. The plurality of wires 18 are provided at a top surface of the multilayer substrate 10. The plurality of mounting electrodes 17 and the plurality of wires 18 are formed of conductive materials (such as metallic foils formed of copper (Cu)).

The secure IC 11, the RFIC 13, a plurality of interlayer connection conductors 15, and a plurality of conductor patterns 16 are provided in the multilayer substrate 10.

The secure IC 11 and the RFIC 13 each have the shape of a plate. As shown in FIGS. 2A and 2B, the area of each principal surface of the secure IC 11 is larger than that of each principal surface of the RFIC 13.

As shown in FIG. 1B, the RFIC 13 is disposed below the secure IC 11 in the downward direction (direction −Z). In other words, for example, the RFIC 13 is disposed in a layer that is closer to the plurality of mounting electrodes 17 than the secure IC 11.

As shown in FIG. 1A, the RFIC 13 is mounted in the multilayer substrate 10 such that the entire principal surfaces of the RFIC 13 are covered by the secure IC 11 in plan view.

A memory 110 (see FIG. 4) is built in the secure IC 11. The secure IC 11 is an IC having a security function, and prevents cloning of authentication information that is stored in the memory 110. The RFIC 13 is an IC having the function of modulating and demodulating high-frequency signals and controlling communication with an external device.

As shown in FIGS. 1B and 2A, a terminal 12A and a terminal 12B are provided at a top surface (surface situated in the direction +Z) of the secure IC 11. As shown in FIGS. 1B and 2B, terminals 14A to 14P are provided at a top surface (surface situated in the direction +Z) of the RFIC 13. In other words, for example, the RFIC 13 has more terminals than the secure IC 11. However, the number of terminals of the secure IC 11 and the number of terminals of the RFIC 13 are not limited to those in FIGS. 2A and 2B. Terminals, serving as dummies that are not connected to internal wires, such as the interlayer connection conductors 15, may be provided at the ICs. However, such terminals are not counted as terminals in the present disclosure.

The plurality of interlayer connection conductors 15 each have the shape of a column extending in the directions +Z and −Z. The plurality of interlayer connection conductors 15 are each formed of a conductive material (whose main component is, for example, tin (Sn) or silver (Ag)). The plurality of conductor patterns 16 each have the shape of a flat film, and are disposed parallel to the top surface of the component-embedded substrate 1. The plurality of conductor patterns 16 are each formed of a conductive material (such as a metallic foil formed of copper (Cu)). The conductor patterns 16 are electrically connected to the interlayer connection conductors 15. The wires 18, which are provided at the top surface of the multilayer substrate 10, are also electrically connected to the interlayer connection conductors 15. The mounting electrodes 17 are also electrically connected to the interlayer connection conductors 15. A circuit in which the secure IC 11 and the RFIC 13 are connected to the mounting electrodes 17 by using the interlayer connection conductors 15, the conductor patterns 16, and the wires 18 is formed.

As shown in FIG. 1B, the terminals 12A and 12B, which are provided at the top surface of the secure IC 11, are electrically connected to the interlayer connection conductors 15. The terminals 14A and 14B, which are provided at the top surface of the RFIC 13, are electrically connected to the interlayer connection conductors 15. Although not shown in FIG. 1B, the terminals 14C to 14P of the RFIC 13 are also electrically connected to the interlayer connection conductors 15. In other words, for example, the number of terminals of the RFIC 13 that are electrically connected to the mounting electrodes 17 is larger than the number of terminals of the secure IC 11 that are electrically connected to the mounting electrodes 17.

Although, among the terminal 12A, the terminal 12B, and the terminals 14A to 14P, there are terminals that are electrically connected to each other via the interlayer connection conductors 15, the conductor patterns 16, and the wires 18, many of the terminals are electrically connected to the mounting electrodes 17 via the interlayer connection conductors 15, the conductor patterns 16, and the wires 18.

In other words, for example, many of the internal wires formed from the interlayer connection conductors 15 and the conductor patterns 16 extend towards a back surface of the multilayer substrate 10 where the plurality of mounting electrodes 17 that are connected to the internal wires are disposed. As a result, there are many internal wires at portions adjacent to the bottom surface of the multilayer substrate 10.

However, when the component-embedded substrate 1 is viewed in plan, the area of the RFIC 13 is smaller than the area of the secure IC 11, and the RFIC 13 is disposed closer to the mounting surface than the secure IC 11. Therefore, in correspondence with the difference between the area of the secure IC 11 and the area of the RFIC 13, space for routing the internal wires can be provided at portions adjacent to the mounting surface of the multilayer substrate 10. Consequently, even if a plurality of ICs are embedded in the component-embedded substrate 1, it is possible to connect the ICs and the mounting electrodes 17 to each other by properly routing the internal wires.

Further, as in the embodiment, even if the number of terminals of the RFIC 13 is large, the component-embedded substrate 1 allows space for routing the internal wires to be provided by disposing the RFIC 13 having a large external shape at a portion adjacent to the mounting surface. Therefore, it is possible to embed a plurality of components including ICs having a large number of terminals without increasing the area of the layers of the multilayer substrate 10, or without increasing the number of layers of the multilayer substrate 10 to route the internal wires to upper and lower layers. In other words, for example, it is possible to embed a plurality of components including ICs having a large number of terminals with the size of the multilayer substrate 10 being kept small.

When the component-embedded substrate 1 is viewed in plan, the entire RFIC 13 is covered by the secure IC 11. Therefore, the area of the layers (XY plane) of the multilayer substrate 10 may be smaller than the area of the layers of a multilayer substrate 10 in which an RFIC 13 is not covered by the secure IC 11. In other words, for example, it is possible to further reduce the size of the component-embedded substrate 1 while providing space for routing the internal wires.

Further, when, as in the embodiment of the present application, the RFIC 13 is mounted such that the terminals 14A to 14P of the RFIC 13 are disposed at a side opposite to the side of the mounting surface of the multilayer substrate 10, the routing of the internal wires becomes more complicated. More specifically, when the multilayer substrate 10 is viewed in plan, the internal wires need to be routed to regions other than the region where the RFIC 13 exists. However, if the structure according to the embodiment is used, it is possible to properly route the internal wires even in such a mounting mode.

Figure 3:
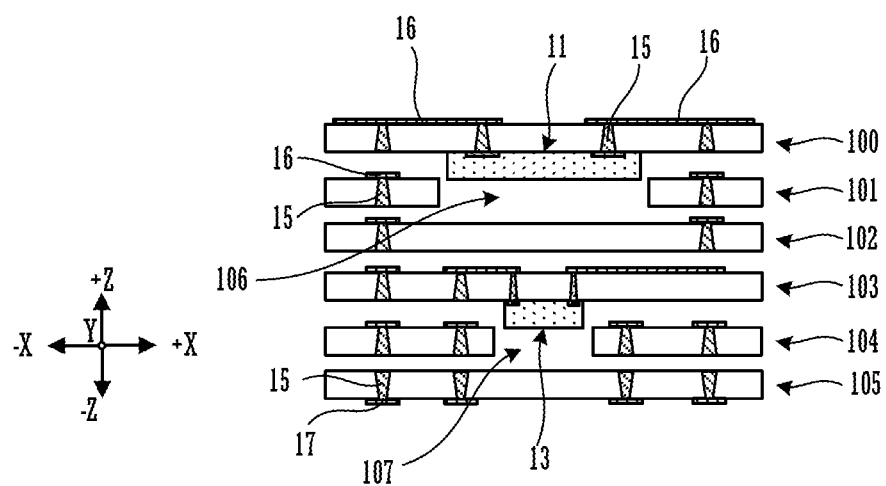
FIG. 3 is a side sectional view of a state in which the component-embedded substrate according to the embodiment is divided into layers.

Next, part of a method for producing the component-embedded substrate 1 is described with reference to FIG. 3. FIG. 3 is a side sectional view of a state in which the component-embedded substrate 1 is divided into layers.

As described above, the multilayer substrate 10 includes insulating resin films 100 to 105 that are stacked upon each other. The insulating resin films 100 to 105 are each formed of thermoplastic resin (such as polyimide or liquid crystal polymer). A copper film is affixed to one surface of each of the insulating resin films 100 to 105.

The plurality of wires 18 and the plurality of conductor patterns 16 are formed by performing patterning on the surfaces (copper-film affixed surfaces) of the insulating resin films 100 to 105 to which the respective copper films have been affixed. The plurality of interlayer connection conductors 15 are formed by providing through holes in the corresponding insulating resin films 100 to 105, filling the through holes with conductive paste, and solidifying the conductive paste. The through holes extend through the corresponding insulating resin films 100 to 105 from the copper-film affixed surfaces of the corresponding insulating resin films 100 to 105 to surfaces opposite to the corresponding copper affixed surfaces.

The secure IC 11 is temporarily pressure-bonded to the bottom surface (surface situated in the direction −Z) of the insulating resin film 100. A cavity 106 for accommodating the secure IC 11 temporarily pressure-bonded to the insulating resin film 100 is formed in the insulating resin film 101. The cavity 106 is a hole that extends through the insulating resin film 101.

The RFIC 13 is temporarily pressure-bonded to a bottom surface (surface situated in the direction −Z) of the insulating resin film 103. A cavity 107 for accommodating the RFIC 13 temporarily pressure-bonded to the insulating resin film 103 is formed in the insulating resin film 104. The cavity 107 is a hole that extends through the insulating resin film 104.

After the insulating resin films 100 to 105 have been stacked upon each other, the insulating resin films 100 to 105 are each subjected to heating and pressure bonding. After the insulating resin films 100 to 105 have been subjected to the heating and pressure bonding, the insulating resin films 100 to 105 are softened and flow, to fill the hollow 106 and the hollow 107. As a result, the secure IC 11 and the RFIC 13 are fixed, so that the multilayer substrate 10 is formed. Here, the aforementioned conductive paste is solidified to form the plurality of interlayer connection conductors 15.

An existing build-up method in which a build-up layer is formed by stacking resin layers one layer at a time requires a base, which becomes a core layer, to have a certain thickness. However, unlike the existing build-up method, the stacking method for the multilayer substrate 10 does not require a base, which becomes a core layer. As a result, the thickness of the multilayer substrate 10 can be restricted. In addition, in the method for producing the multilayer substrate 10, it is not necessary to stack layers one layer at a time. Therefore, this method is simpler than the existing build-up method.

When the insulating resin films 100 to 105 are subjected to the heating and pressure bonding, the interlayer connection conductors 15 are solidified and are bonded to the terminal 12A, the terminal 12B, and the terminals 14A to 14P. By causing the insulating resin films 100 to 105 to flow as a result of softening the insulating resin films 100 to 105, pressure generated by the pressure bonding tends to be applied to the plurality of interlayer connection conductors 15. As a result, the interlayer connection conductors 15 are more firmly bonded to the terminal 12A, the terminal 12B, and the terminals 14A to 14P.

Further, by making use of the fact that the insulating resin films 100 to 105 flow as a result of being softened, the interlayer connection conductors 15 are not only firmly bonded to the terminal 12A, the terminal 12B, and the terminals 14A to 14P, but also more firmly bonded to the conductor patterns 16 and the wires 18.

The RFIC 13 is covered by the secure IC 11, and the surface of the RFIC 13 (surface situated in the direction +Z) where the terminals 14A to 14P exist and a bottom surface (surface situated in the direction −Z) of the secure IC 11 are parallel to and oppose each other. Therefore, the pressure generated by the heating and pressure bonding of the multilayer substrate 10 is uniformly applied to the terminals 14A to 14P of the RFIC 13. Therefore, it is possible to more reliably bond the terminals 14A to 14P of the RFIC 13 to the interlayer connection conductors 15.

The secure IC 11 whose area is larger than that of the RFIC 13 in plan view is disposed so as to, in plan view, cover the surface of the RFIC 13 (surface situated in the direction +Z) where the terminals 14A to 14P exist. Therefore, it is possible to, during the heating and pressure bonding, reduce ununiform flow of resin between the secure IC 11 and the surface of the RFIC 13 (surface situated in the direction +Z) where the terminals 14A to 14P exist. Consequently, it is possible to more reliably bond the terminals 14A to 14P of the RFIC 13 and the interlayer connection members 15 to each other.

A small embedded component, such as the RFIC 13, tends to be more easily moved and tilted by the flow of resin than a large embedded component, such as the secure IC 11. In addition, a flat surface of the secure IC 11 where the terminals do not exist opposes the surface of the RFIC 13 (surface situated in the direction +Z) where the terminals 14A to 14P exist. Therefore, it is possible to, during the heating and pressure bonding, further reduce ununiform flow of resin between the secure IC 11 and the surface of the RFIC 13 (surface situated in the direction +Z) where the terminals 14A to 14P exist.

As mentioned above, in order to electrically connect the conductor patterns 16 to the terminal 12A, the terminal 12B, and the terminals 14A to 14P, it is not necessary to provide, for example, solder bumps or layers to which solder has been applied. Therefore, the component-embedded substrate 1 can be made thin.

It is possible to bond the interlayer connection conductors 15 to the wires 18, the conductor patterns 16, the terminal 12A, the terminal 12B, and the terminals 14A to 14P at the same time when the insulating resin films 100 to 105 are subjected to the heating and pressure bonding.

Figure 4:
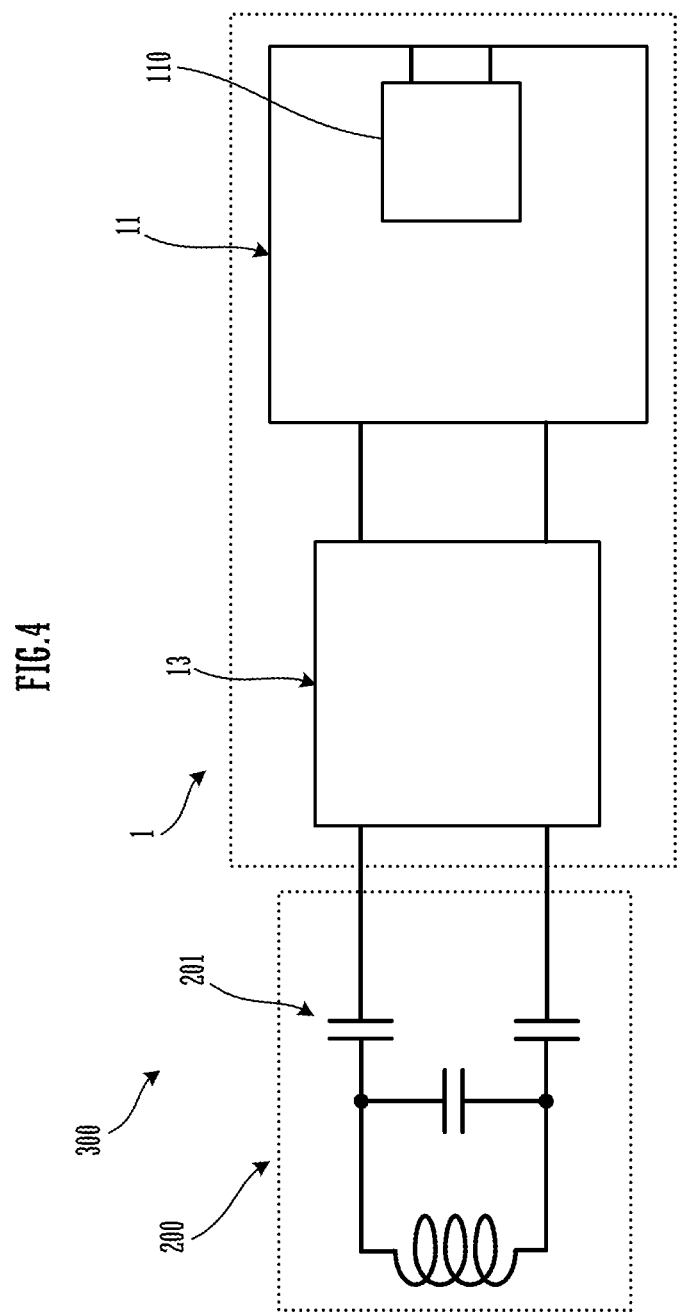
FIG. 4 is a circuit block diagram of a communication module including the component-embedded substrate according to the embodiment.

Next, an example of mounting the component-embedded substrate 1 according to the embodiment is described with reference to FIG. 4. FIG. 4 is a circuit block diagram of a communication module 300 including the component-embedded substrate 1.

The communication module 300 includes the component-embedded substrate 1 and a mount substrate 200. The mount substrate 200 is a mount substrate for achieving a radio frequency (RF) circuit. A circuit element group for achieving the RF circuit are mounted at the mount substrate 200. In addition, the component-embedded substrate 1 is mounted at the mount substrate 200.

The RFIC 13 is connected to a filter element 201 at the mount substrate 200. The secure IC 11 is connected to the RFIC 13. The memory 110 is built in the secure IC 11, and is not used to perform direct reading and writing for something other than the secure IC 11.

Since high-frequency signals are processed at the RFIC 13, the RFIC 13 more easily emits electromagnetic waves than the secure IC 11. However, as shown in FIG. 1B, the electromagnetic waves that are emitted from the RFIC 13 in the direction +Z are electromagnetically blocked by the secure IC 11 situated in the direction +Z from the RFIC 13, so that the electromagnetic waves do not easily pass through the secure IC 11. As a result, the electromagnetic waves do not easily leak out of the component-embedded substrate 1. In addition, since the area of the secure IC 11 is larger than the area of the RFIC 13 and the secure IC 11 covers the RFIC 13 in plan view of the component-embedded substrate 1, the electromagnetic blocking can be more effectively performed.

The secure IC 11 and the RFIC 13 are embedded in the component-embedded substrate 1. It is possible to dispose the component that easily emits electromagnetic waves close to the mounting electrodes 17 and to dispose the component that does not easily emit electromagnetic waves far away from the mounting electrodes 17. In this form, electromagnetic waves do not easily leak out from a side opposite to the side of the mounting surface of the component-embedded substrate 1.

Although, in plan view of the component-embedded substrate 1, the entire RFIC 13 is covered by the secure IC 11, part of the RFIC 13 may be covered by the secure IC 11.

In the embodiment, the RFIC 13 and the secure IC 11 are used as a first embedded component and a second embedded component, respectively. However, components other than the RFIC 13 and the secure IC 11 may be used as embedded components.

What is claimed is:

1. A component-embedded substrate in which a plurality of embedded components that are electrically connected to a conductor formed at the multilayer substrate are provided in a multilayer substrate including a plurality of resin films that are stacked upon each other, and in which a mounting electrode is formed at a principal surface, the component-embedded substrate comprising:

a first embedded component that is positioned in a layer that is close to the mounting electrode, the first embedded component including terminals that are electrically connected to a conductor formed at the multilayer substrate; and a second embedded component that is positioned in a layer that is farther away from the mounting electrode than the layer where the first embedded component is positioned, the second embedded component including terminals that are electrically connected to a conductor formed at the multilayer substrate, wherein each resin film is formed of thermoplastic resin, wherein the number of terminals of the first embedded component is larger than the number of terminals of the second embedded component, and wherein, in plan view, an area of the first embedded component is smaller than an area of the second embedded component.

2. The component embedded substrate according to claim 1, wherein, in plan view, the first embedded component is covered by the second embedded component.

3. The component embedded substrate according to claim 2, wherein, in plan view, the entire first embedded component is covered by the second embedded component.

4. The component embedded substrate according to claim 3, wherein the terminals of the first embedded component and the terminals of the second embedded component include a terminal or terminals that are electrically connected to an interlayer connection conductor formed at the multilayer substrate.

5. The component embedded substrate according to claim 4, wherein the second embedded component less easily emits an electromagnetic wave than the first embedded component.

6. The component embedded substrate according to claim 3, wherein the second embedded component less easily emits an electromagnetic wave than the first embedded component.

7. The component embedded substrate according to claim 2, wherein the terminals of the first embedded component and the terminals of the second embedded component include a terminal or terminals that are electrically connected to an interlayer connection conductor formed at the multilayer substrate.

8. The component embedded substrate according to claim 7, wherein the second embedded component less easily emits an electromagnetic wave than the first embedded component.

9. The component embedded substrate according to claim 2, wherein the second embedded component less easily emits an electromagnetic wave than the first embedded component.

10. The component embedded substrate according to claim 1, wherein the terminals of the first embedded component and the terminals of the second embedded component include a terminal or terminals that are electrically connected to an interlayer connection conductor formed at the multilayer substrate.

11. The component embedded substrate according to claim 10, wherein the second embedded component less easily emits an electromagnetic wave than the first embedded component.

12. A communication module comprising:

a component-embedded substrate in which a plurality of embedded components that are electrically connected to a conductor formed at the multilayer substrate are provided in a multilayer substrate including a plurality of resin films that are stacked upon each other, and in which a mounting electrode is formed at a principal surface, the component-embedded substrate comprising:

a first embedded component that is positioned in a layer that is close to the mounting electrode, the first embedded component including terminals that are electrically connected to a conductor formed at the multilayer substrate; and a second embedded component that is positioned in a layer that is farther away from the mounting electrode than the layer where the first embedded component is positioned, the second embedded component including terminals that are electrically connected to a conductor formed at the multilayer substrate, wherein each resin film is formed of thermoplastic resin, wherein the number of terminals of the first embedded component is larger than the number of terminals of the second embedded component, and wherein, in plan view, an area of the first embedded component is smaller than an area of the second embedded component, wherein the first embedded component is an RFIC that processes a high-frequency signal, and wherein the second embedded component is a secure IC having a security function.

13. The communication module according to claim 12, wherein, in plan view, the first embedded component is covered by the second embedded component.

14. The communication module according to claim 13, wherein, in plan view, the entire first embedded component is covered by the second embedded component.

15. The component embedded substrate according to claim 14, wherein the terminals of the first embedded component and the terminals of the second embedded component include a terminal or terminals that are electrically connected to an interlayer connection conductor formed at the multilayer substrate.

16. The component embedded substrate according to claim 13, wherein the terminals of the first embedded component and the terminals of the second embedded component include a terminal or terminals that are electrically connected to an interlayer connection conductor formed at the multilayer substrate.

17. The component embedded substrate according to claim 13, wherein the second embedded component less easily emits an electromagnetic wave than the first embedded component.

18. The component embedded substrate according to claim 12, wherein the terminals of the first embedded component and the terminals of the second embedded component include a terminal or terminals that are electrically connected to an interlayer connection conductor formed at the multilayer substrate.

* * * * *